(12) United States Patent
Habuka (10) Patent No.: US 6,238,478 B1
(45) Date of Patent: May 29, 2001

(54) SILICON SINGLE CRYSTAL AND PROCESS FOR PRODUCING SINGLE-CRYSTAL SILICON THIN FILM

(75) Inventor: Hitoshi Habuka, Annaka (JP)

(73) Assignee: Shin-Etsu Handotai, Co., Ltd., Tokyo (JP)

( * ) Notice: Subject to any disclaimer, the term of this patent is extended or adjusted under 35 U.S.C. 154(b) by 0 days.

(21) Appl. No.: 09/142,494

(22) PCT Filed: Mar. 7, 1997

(86) PCT No.: PCT/JP97/00716

§ 371 Date: Dec. 18, 1998

§ 102(e) Date: Dec. 18, 1998

(87) PCT Pub. No.: WO97/33305

PCT Pub. Date: Sep. 12, 1997

(30) Foreign Application Priority Data

Mar. 9, 1996 (JP) .................................... 8-080572

(51) Int. Cl.[7] .................................... C30B 15/04
(52) U.S. Cl. .................... 117/19; 117/88; 117/928; 427/248.1; 427/255

(58) Field of Search ................ 117/88, 95, 928, 117/13, 19; 427/248.1, 255

(56) References Cited

U.S. PATENT DOCUMENTS

5,355,831 10/1994 Schauer .

*Primary Examiner*—Felisa Hiteshew
(74) *Attorney, Agent, or Firm*—Snider & Associates; Ronald R. Snider (57) ABSTRACT

A first layer having a same conductivity and a substantially identical concentration as a CZ substrate having a high impurity concentration is formed by a vapor phase growth process on the substrate directly, a pressure is changed to purge an atmosphere, and then a second layer having a same conductivity as the substrate and having a lower concentration by 3 or more orders of magnitude than the substrate is formed by the vapor phase growth process. Thereby there is simply and inexpensively formed a silicon single crystal thin film by the vapor phase growth process which film has no crystal defective layer and has a dopant concentration abruptly changing at an interface between the film and a high concentration layer.

9 Claims, 6 Drawing Sheets

SILICON SINGLE CRYSTAL AND PROCESS FOR PRODUCING SINGLE-CRYSTAL SILICON THIN FILM

TECHNICAL FIELD

This invention relates to a method for fabricating a silicon single crystal thin film by a vapor phase growth.

BACKGROUND ART

Figure 5:
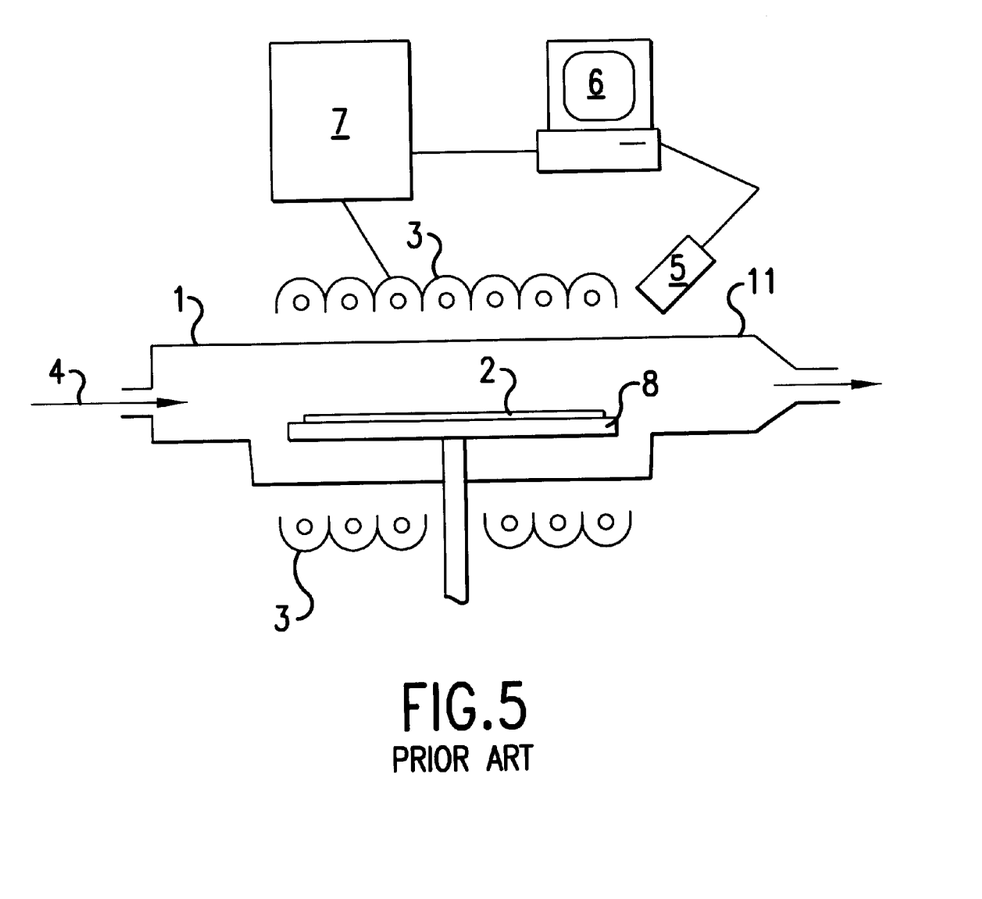
FIG. 5 schematically shows a cross-sectional view of an example of prior art vapor phase growth apparatus.

When it is desired to form a thin film of silicon single crystal (which film will be sometimes referred to merely as the thin film, hereinafter) on a silicon single crystal substrate (which will be sometimes referred to merely as the substrate, hereinafter), a pre-treatment step and a vapor phase growth step have conventionally been sequentially carried out with use of such an apparatus as shown in FIG. 5.

(1) Pre-Treatment Step (of removing a silicon oxide film on a main surface of a substrate):

In such an apparatus as shown in FIG. 5, a silicon single crystal substrate 2 is placed on a susceptor 8 within a reaction vessel 11, and a nitrogen gas is supplied into the reaction vessel 11 to purge air within the vessel. Next, after the nitrogen gas has been purged with a hydrogen gas, the substrate 2 is heated by a radiation heater 3 provided on upper and lower sides of a vessel wall 1 to such a temperature suitable for the pre-treatment as, e.g., about 1200° C. for a predetermined time, e.g., for about one minute while the hydrogen gas is continuously supplied into the vessel. In the pre-treatment step, the temperature of the substrate is set and kept at a level higher than the temperature in the vapor phase growth step, whereas an internal pressure of the vessel is kept at, e.g., atmospheric pressure (which will be expressed in terms of absolute pressure in this specification, hereinafter).

Since a native oxide film, that is, silicon oxide film formed on the substrate 2 due to oxygen in the air (or a silicon oxide film intentionally formed) is removed by hydrogen reduction in a high-temperature during the pre-treatment step, there can be formed a silicon single crystal thin film which has a good crystallization in the vapor phase growth step.

In the pre-treatment step, since the silicon single crystal substrate is heat-treated at a high temperature of 1200° C. in a hydrogen atmosphere, so that a quantity of oxygen atoms in the vicinity of the surface of the substrate is reduced by outdiffusion during the heat treatment. Thus, when a silicon single crystal thin film is grown and then subjected to a series of heat treatments, a denuded zone (or DZ layer) having a remarkably less number of defects and having a width of about 10 μm is formed in the vicinity of the surface of the substrate.

Interstitial oxygens contained within the single crystal grown by a Czochralski method, when subjected to a series of heat treatments, form oxygen precipitates. Since the oxygen precipitates have an ability to getter such heavy metals as Cu or Ni atoms which lead to generation of a leakage current, a certain amount of interstitial oxygen is intentionally included in the single crystal to prevent the heavy metal pollution.

In a CZ substrate containing interstitial oxygens, however, if the amount of oxygens are not decreased sufficiently in the vicinity of the surface of the CZ substrate, then crystal defects will take place even in a silicon single crystal thin film formed directly above the CZ substrate. For this reason, it is important to heat-treat the silicon single crystal substrate at a high temperature before the silicon single crystal thin film (on which an integrated circuit is to be formed) is to be grown by the vapor phase growth step, to form the DZ layer.

(2) Vapor Phase Growth Step (forming a silicon single crystal thin film):

After the pre-treatment step, the substrate 2 is heated by the radiation heater 3 to and kept at a temperature suitable for vapor phase growth. Under this condition, a reactant gas 4 consisted of a carrier gas and reaction source material is made to flow along the main surface of the substrate 2. When the substrate 2 has a temperature suitable for a thin film growth, e.g., of 800 to 1200° C., a chemical reaction of the reactant gas 4 causes a thin film to grow on the surface of the substrate 2.

In this case, radiation emitted from the substrate 2 is caught by a radiation thermometer 5, which in turn sends an intensity of the caught radiation to a computer 6 to convert it to a temperature. The computer 6 then sends the converted temperature to a temperature controller 7 to supply a necessary power to the radiation heater 3.

When a substrate which has an impurity concentration not less than $1 \times 10^{18}$ atoms/cm$^3$ is employed, dopants tend to be liberated from the substrate through their outdiffusion or etching and to scatter within the reaction vessel in the pre-treatment step. For this reason, liberated dopants tend to easily mix into the silicon single crystal thin film during the vapor phase growth. As a result, a dopant concentration at an interface between the thin film and substrate varies actually gently with a very dull gradient, which disadvantageously results in a large transition width, though it is desirable to abruptly change the dopant concentration. A transition width means a width necessary for the transition from the dopant concentration of a substrate to the dopant concentration of a thin film.

As means for solving these problems, it is considered to set the temperatures of the pre-treatment step and vapor phase growth step at levels (e.g., 1000° C. or less) somewhat lower than the conventional levels. However, this involves a new problem that, when the pre-treatment is not carried out for a considerably long time, the DZ layer will not be substantially formed or not formed at all in the vicinity of the surface of the substrate.

The present invention has been made in view of the above problems in the prior art, and a first object thereof is to provide a silicon single crystal and a method for fabricating a silicon single crystal thin film, which can solve the above problems in the prior art and which can form a DZ layer having substantially the same quality as when the aforementioned pre-treatment is carried out.

A second object of the present invention is to fabricate a silicon single crystal thin film which is doped with a low concentration of impurity, which is formed by a vapor phase growth process on a silicon single crystal doped with a high concentration of impurity, and in which a dopant concentration at an interface between the silicon single crystal and thin film abruptly changes.

DISCLOSURE OF INVENTION

In order to attain the first object, a silicon single crystal of the present invention is featured by having a silicon single crystal thin film which comprises a first layer formed directly on a silicon single crystal substrate with a same conductivity as the silicon single crystal substrate and a substantially identical impurity concentration as the silicon single crystal substrate through the first layer by a vapor phase growth process, the silicon single crystal substrate being doped with a high impurity concentration, containing interstitial oxygens and being grown by a Czochralski method, and which also comprises a second layer formed directly on the first layer by the vapor phase growth process with the same conductivity as the silicon single crystal substrate and an impurity concentration lower by 3 or more orders of magnitude than the silicon single crystal substrate. Said first layer has a thickness of preferably 2 to 15 μm.

A silicon single crystal thin film formed by a vapor phase growth process has an oxygen concentration much smaller than that of the single crystal substrate grown by the Czochralski method. That is, the region having a low oxygen concentration may be formed, in place of a high temperature heat-treatment, by growing a thin film having the same width as the DZ layer.

In the high temperature heat-treatment carried out before the vapor-phase growth of the thin film, the region having the low oxygen concentration is usually formed in an area 2 to 15 μm deep from the surface of the single crystal substrate. Accordingly, it is preferable that said first layer has a thickness of 2 to 15 μm.

With respect to the impurity concentration of the substrate, when the concentration is in a range of about $1 \times 10^{18}$ to $1 \times 10^{20}$ atoms/cm$^3$, it is interpreted as a high concentration. This concentration corresponds to a resistivity of about 0.06 to 0.0012 Ω.cm when the impurity is p type.

In order to attain the first object of the present invention, a method for fabricating a silicon single crystal thin film in accordance with the present invention is featured by including a first vapor phase growth step for forming a first layer directly on a silicon single crystal substrate with a same conductivity as the silicon single crystal substrate and a substantially identical impurity concentration as the silicon single crystal substrate through the first layer by a vapor phase growth process, the silicon single crystal substrate being doped with a high impurity concentration, and a second vapor phase growth step for forming a second layer directly on the first layer by the vapor phase growth process with the same conductivity as the silicon single crystal substrate and an impurity concentration lower by 3 or more orders of magnitude than the silicon single crystal substrate.

By the first vapor phase growth step of the present invention, a region of a low oxygen concentration obtained by subjecting a substrate to a high temperature heat-treatment in a hydrogen atmosphere in the above prior art, can be reliably formed without subjecting to the high temperature heat-treatment.

The second object of the present invention is to fabricate a silicon single crystal thin film in which a dopant concentration at an interface between a substrate and the thin film abruptly changes. In order to attain the above object, in the method for fabricating the silicon single crystal thin film in accordance with the present invention, an intermediate step is provided between the first vapor phase growth step and the second vapor phase growth step, and it is preferable that impurities in a purge atmosphere of the intermediate step are discharged under a condition that a pressure in the purge atmosphere is set to be higher than that in the first vapor phase growth step.

In this method, dopants in an atmosphere in the vicinity of the silicon single crystal thin film with the low impurity concentration being grown in the second vapor phase growth step is diluted with a gas introduced for the purpose of increasing the pressure and thus a dopant concentration is decreased. As a result, such an action takes place as to suppress autodoping in the second vapor phase growth step, which results in that a dopant concentration in the interface zone of the silicon single crystal thin film with the low impurity concentration can have an abrupt gradient.

Further, in order to attain the second object, in accordance with the present invention, an intermediate step is provided between the first vapor phase growth step and the second vapor phase growth step, and it is also effective in the intermediate step that impurities in a purge atmosphere are discharged under a condition that a pressure in the purge atmosphere is set to be lower than that in the first vapor phase growth step.

In this method, the reduction of the pressure causes the dopant concentration in the system to be reduced so that operations and effects take place similar to those under the condition that the pressure of the purge atmosphere in the intermediate step is set to be higher than that in the first vapor phase growth step as mentioned above. In the intermediate step, further, when an increase and a decrease in the pressure of the purge atmosphere are repeated by 1 or more times to discharge impurities in the purge atmosphere, this is also effective.

As mentioned above, for example, as means for setting the pressure of the purge atmosphere in the intermediate step to be higher than that in the first vapor phase growth step, it is preferable to maintain the growth atmosphere in its vacuum state for vapor phase growth in the first vapor phase growth step, to gradually increase the pressure of the purge atmosphere to atmospheric pressure in the intermediate step, and to keep the growth atmosphere at the atmospheric pressure for vapor phase growth in the second vapor phase growth step.

In order to set the pressure of the growth atmosphere in such a manner as mentioned above, there can be employed a method by which the growth atmosphere is discharged by means of a vacuumizing device in the first vapor phase growth step, the discharging operation of the purge atmosphere is gradually switched from the discharge with use of the vacuumizig device to the discharge with use of a normal pressure pumping device in the intermediate step, and the growth atmosphere is discharged by means of the normal pressure exhaust device in the second vapor phase growth step.

As mentioned above, as means for setting the pressure of the purge atmosphere in the intermediate step to be lower than that in the first vapor phase growth step, it is effective to keep the growth atmosphere at a normal pressure for a vapor phase growth in the first vapor phase growth step, to gradually decrease the pressure of the purge atmosphere to a vacuum in the intermediate step, and to keep the growth atmosphere at the vacuum for a vapor phase growth in the second vapor phase growth step.

In order to gradually reduce the pressure of the purge atmosphere to a vacuum in the intermediate step in such a manner as mentioned above, there can be employed a method by which the reaction atmosphere is discharged by means of the normal pressure exhaust device in the first vapor phase growth step, the discharging operation of the purge atmosphere is gradually switched from the discharge with use of the normal pressure exhaust device to the discharge with use of the vacuumizing device in the intermediate step, and the reaction atmosphere is discharged by means of the vacuumizing device in the second vapor phase growth step.

In the present invention, a temperature of a substrate in the intermediate step is set to be lower than a substrate temperature in the first vapor phase growth step, which is also an effective means. In this method, since the liberation of dopant atoms from the substrate and from the silicon single crystal thin film containing a high concentration of impurity grown in the first vapor phase growth step is suppressed, the autodoping to the epitaxial layer generated in the second vapor phase growth step can be suppressed and prevented.

The present invention can be applied even when a substrate has an oxide film thereon. In this case, a pre-treatment step is provided prior to the first vapor phase growth step. In the pre-treatment step, a reducing gas is supplied to the surface of the substrate while the substrate is heated to thereby remove the oxide film from the substrate surface. In other words, in the present invention, when the substrate has no such oxide film thereon, the above pre-treatment step is unnecessary.

BEST MODE FOR CARRYING OUT THE INVENTION

The feature, function and effect of the present invention will next be explained in connection with Examples shown in the drawings.

EXAMPLE 1
(When a First Layer Having a High Impurity Concentration and a Second Layer Having a Low Impurity Concentration are Formed Under Pressures of 0.1 atm. and 1 atm. by a Vapor Phase Growth Process, Respectively)
(1) Pre-treatment Step A silicon single crystal substrate 2 having a boron impurity concentration of $7 \times 10^{18}$ atoms/cm$^3$ was placed on a susceptor 8 within a reaction vessel 11 of such a horizontal vapor phase growth apparatus as shown in FIG. 5. A nitrogen gas was first introduced into the reaction vessel 11 to purge air within the vessel. Subsequently, after the introduction of the nitrogen gas was stopped, 100 liters of hydrogen gas was introduced while the substrate 2 was heated by a radiation heater 3 to 1100° C. and kept thereat. In this pre-treatment step, a pressure within the reaction vessel 11 was set at 0.1 atm. and a pre-treatment time was set at 1.5 minutes. The heating of the substrate 2 was carried out in the same manner as in the above prior art method with use of a radiation thermometer 5 and a temperature controller 7.
(2) First Vapor Phase Growth Step Trichlorosilane was added to the hydrogen gas at a rate of 22 g/min. while a temperature in the reaction vessel 11 is kept at 1100° C. At the same time, a hydrogen gas having a diborane concentration of 600 ppm is added to the hydrogen gas at a rate of 10 liters/min. so that a first vapor phase growth step was carried out for 2.5 minutes with a total of 100 liters/min. of gas flow. As a result, a first layer having an impurity concentration of $7 \times 10^{18}$ atoms/cm$^3$, a resistivity of 0.015 Ω.cm and a thickness of 10 μm was formed on the substrate by a vapor phase growth process.
(3) Intermediate Step After the first vapor phase growth step was completed by stopping the supply of trichlorosilane with the substrate temperature kept at 1100° C., the temperature controller 7 was adjusted to drop the substrate temperature to 900° C. Next, the substrate temperature was kept at 900° C. and the hydrogen gas was supplied at a rate of 100 liters/min., under which condition the intermediate step was carried out for 10 minutes. In the intermediate step, from its start point, the discharging operation of the reaction vessel was gradually switched from a vacuum system to a normal pressure system to thereby gradually increase the internal pressure of the reaction vessel from 0.1 atm. and at the end of the intermediate step, to 1 atm.
(4) Second Vapor Phase Growth Step Trichlorosilane was added to the hydrogen gas at a rate of 22 g/min. while the pressure of the reaction vessel was kept at 1 atm. and the substrate temperature was kept at 900° C. At the same time, a hydrogen gas having a diborane concentration of 50 ppm was added to the hydrogen gas at a rate of 10 liters/min. so that a second vapor phase growth step was carried out for 4 minutes with a total of 100 liters/min. of gas flow. As a result, a second layer having a impurity concentration of $3 \times 10^{15}$ atoms/cm$^3$, a resistivity of 4.5 Ω.cm and a thickness of 2 μm was formed above the substrate by a vapor phase growth process.

Figure 1:
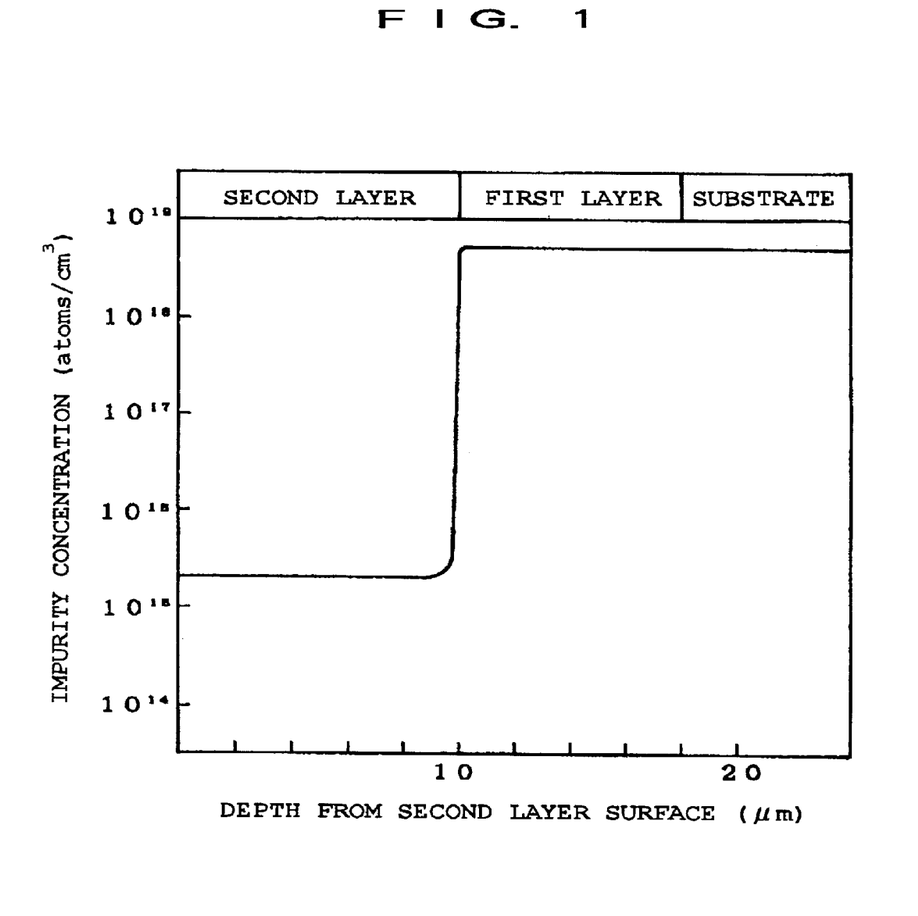
FIG. 1 is a graph showing an impurity concentration profile of a silicon single crystal in accordance with the present invention.
Figure 2:
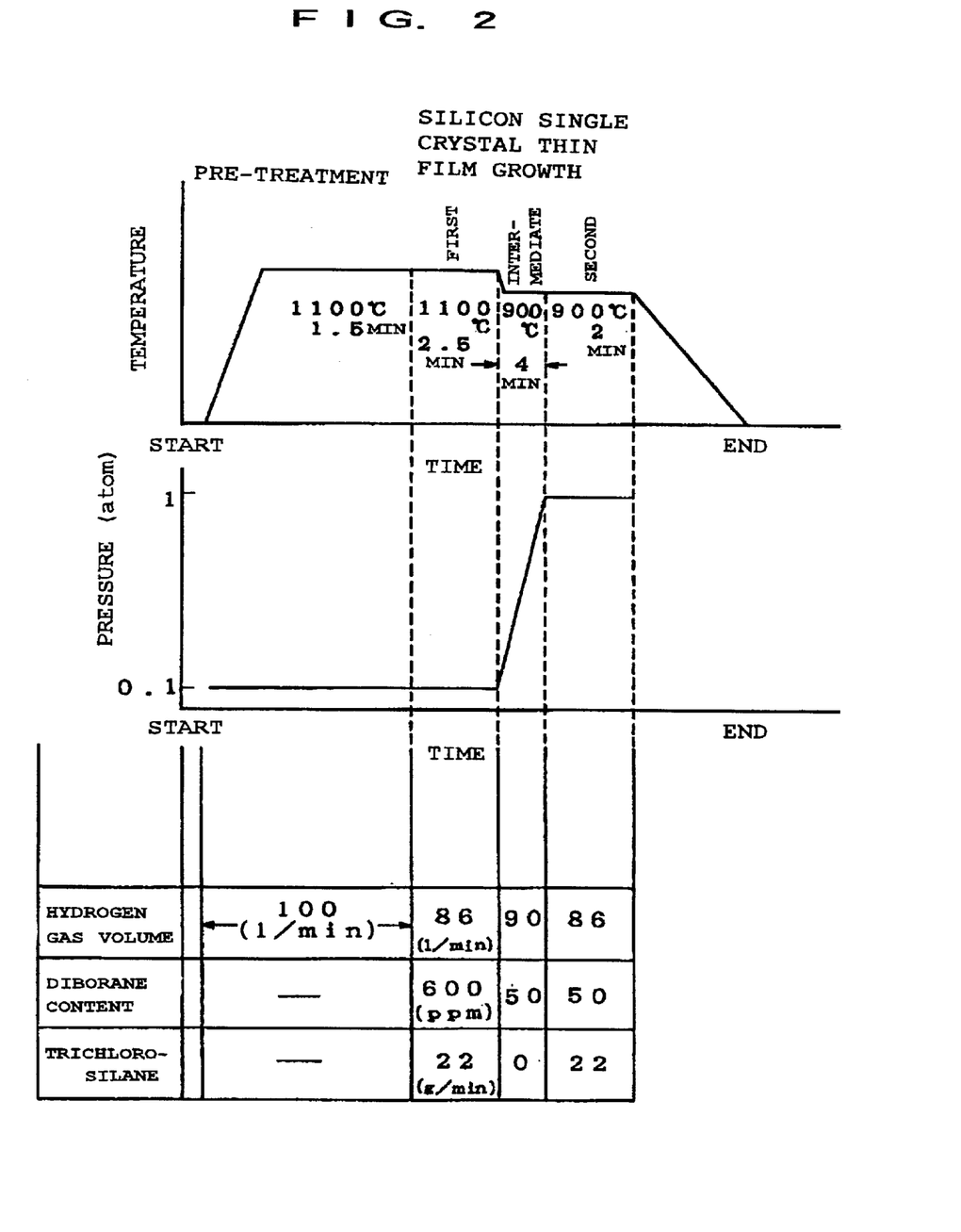
FIG. 2 is a graph showing processing steps and processing conditions (temperature, pressure, etc.) in Example 1 in accordance with the present invention.

The above processing conditions of the respective steps from the pre-treatment step to the second vapor phase growth step was illustrated in FIG. 2, and there was able to obtain a silicon single crystal having such an impurity concentration profile as shown in FIG. 1. A transition width at an interface between the first layer and the second layer was 0.8 μm.

Figure 3:
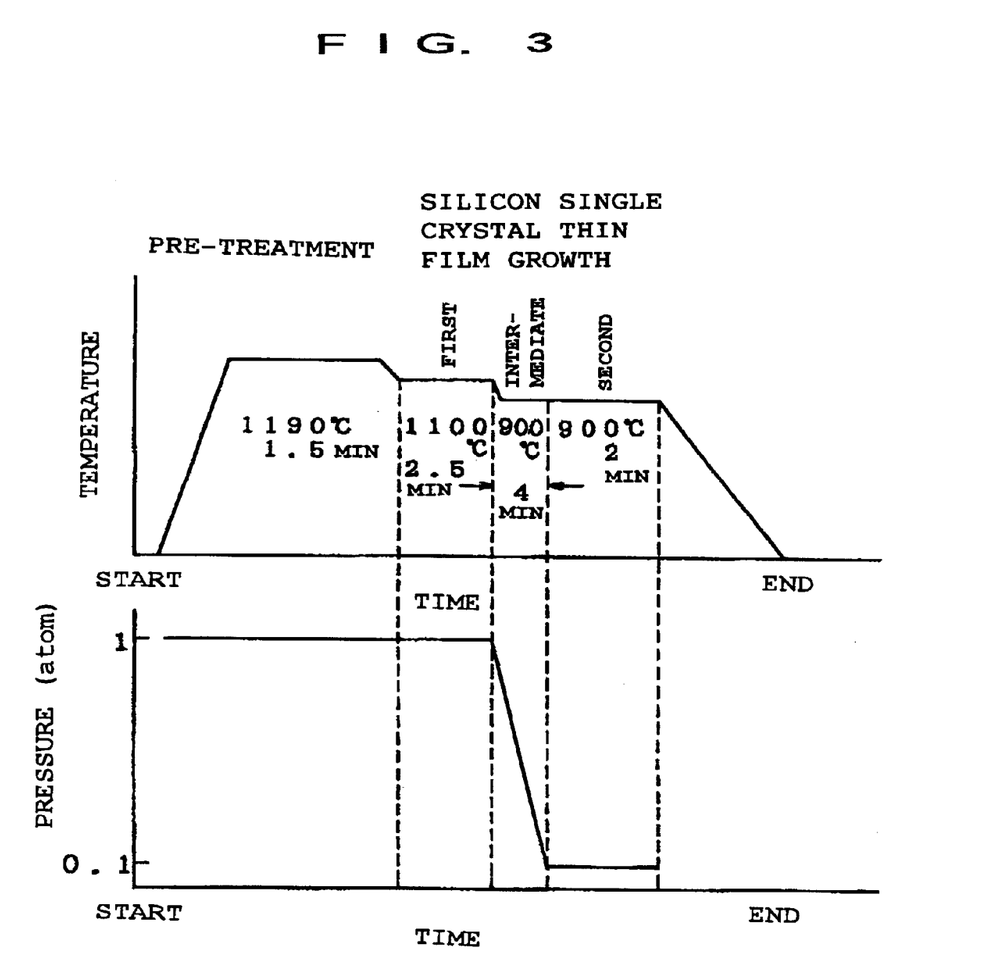
FIG. 3 is a graph showing processing steps and processing conditions (temperature, pressure, etc.) in Example 2 in accordance with the present invention.
Figure 4:
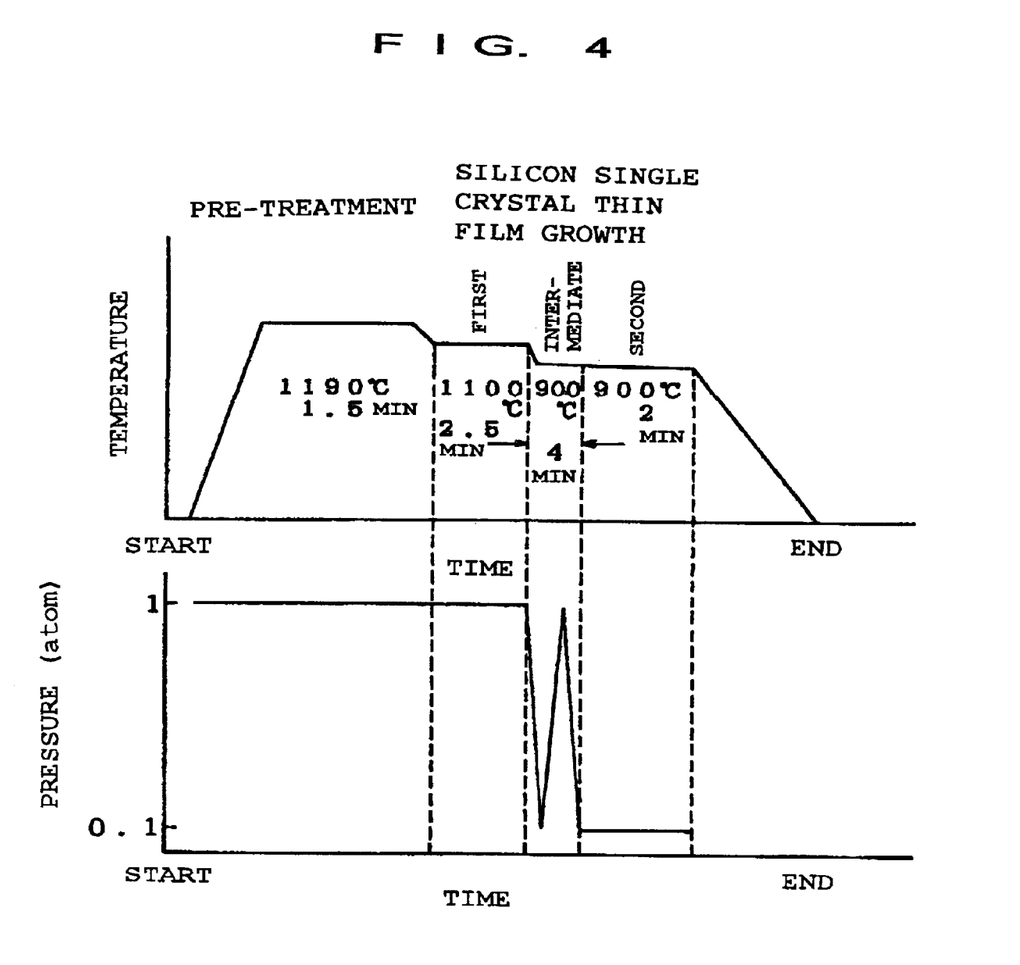
FIG. 4 is a graph showing other processing steps and processing conditions (temperature, pressure, etc.) in Example 2 in accordance with the present invention.

EXAMPLE 2
(When a First Layer Having a High Impurity Concentration and a Second Layer Having a Low Impurity Concentration are Formed Under Pressures of 1 atm. and 0.1 atm. by a Vapor Phase Growth Process, Respectively)
(1) Pre-treatment Step The nitrogen gas purge within the reaction vessel and the pre-treatment were carried out similarly to those in Example 1 except for that the pressure in the reaction vessel in the pre-treatment step was kept at 1 atm. and the temperature of the substrate 2 was kept at 1190° C.
(2) First Vapor Phase Growth Step The temperature controller 7 was adjusted to reduce the substrate temperature to 1100° C., and thereafter the gas having the same component and composition as in Example 1 was supplied into the reaction vessel at the same rate as in Example 1 while the substrate is kept at above temperature to perform the first vapor phase growth step for 2.5 minutes. This resulted in formation of a first layer having an impurity concentration of $5 \times 10^{18}$ atoms/cm$^3$, a resistivity of 0.02 Ω.cm and a thickness of 9 μm on the substrate having an impurity concentration of $7 \times 10^{18}$ atoms/cm$^3$ by the vapor phase growth process.
(3) Intermediate Step The supply of trichlorosilane was stopped with the substrate temperature kept at 1100° C. to thereby complete the first vapor phase growth step. Thereafter the temperature controller 7 was adjusted to reduce the substrate temperature to 900° C. Then the substrate temperature was kept at 900° C. and the hydrogen gas was supplied at a rate of 100 liters/min., under which condition the intermediate processing step was carried out for 10 minutes. In this intermediate processing step, from its start time point, the discharging operation of the reaction vessel was switched gradually from the normal pressure system to the vacuum system as shown in FIG. 3, to gradually reduce the internal pressure of the reaction vessel from 1 atm. and at the end of the intermediate step, to 0.1 atm. At this time, as shown in FIG. 4, when an increase and a decrease in the pressure were repeated by once or more, the above becomes more effective.

(4) Second Vapor Phase Growth Step

A gas having the same component and composition as those in Example 1 was supplied into the reaction vessel at the same rate as in Example 1 while the internal pressure of the reaction vessel was kept at 0.1 atm. and the substrate temperature was kept at 900° C. respectively, under which condition the second vapor phase growth step was carried out for 4 minutes. This resulted in formation of a second layer which has an impurity concentration of $2.6 \times 10^{15}$ atoms/cm$^3$, a resistivity of 5 Ω.cm and a thickness of 1.5 μm above the substrate by the vapor phase growth process.

Comparative Example 1
(When all Steps From the Pre-treatment Step to the Second Vapor Phase Growth Step Were Carried out Under a Pressure of 1 atm.)

(1) Pre-Treatment Step

The nitrogen gas purge within the reaction vessel and the pre-treatment were carried out similarly to those in Example 1 except for that the pressure in the reaction vessel in the pre-treatment step was kept at 1 atm.

(2) First Vapor Phase Growth Step

While the temperature within the reaction vessel 11 was kept at 1100° C., a gas having the same component and composition as those in Example 1 was supplied into the reaction vessel at the same flow rate as in Example 1 to perform the first vapor phase growth step for 2.5 min. This resulted in formation of a first layer having an impurity concentration of $7 \times 10^{18}$ atoms/cm$^3$, a resistivity of 0.015 Ω.cm and a thickness of 10 μm on the substrate having an impurity concentration of $7 \times 10^{18}$ atoms/cm$^3$ by the vapor phase growth process.

(3) Intermediate Step

The substrate temperature was kept at 1100° C. and the supply of trichlorosilane was stopped to thereby complete the first vapor phase growth step. Thereafter the controller 7 was adjusted to reduce the substrate temperature to 900° C. Then the substrate temperature was kept at 900° C. and a hydrogen gas was supplied at a rate of 100 liters/min., under which condition the intermediate step was carried out for 10 minutes. In this intermediate step, the internal pressure of the reaction vessel 11 was kept at 1 atm.

(4) Second Vapor Phase Growth Step

While the internal pressure of the reaction vessel was kept at 1 atm. and the substrate temperature was kept at 900° C. respectively, a gas having the same component and composition as those in Example 1 was supplied into the reaction vessel 11 at the same flow rate as in Example 1 to perform the second vapor phase growth step for 4 minutes. This resulted in formation of a second layer having an impurity concentration of $3 \times 10^{15}$ atoms/cm$^3$, a resistivity of 4.5 Ω.cm and a thickness of 2 μm above the substrate by the vapor phase growth process.

Figure 6:
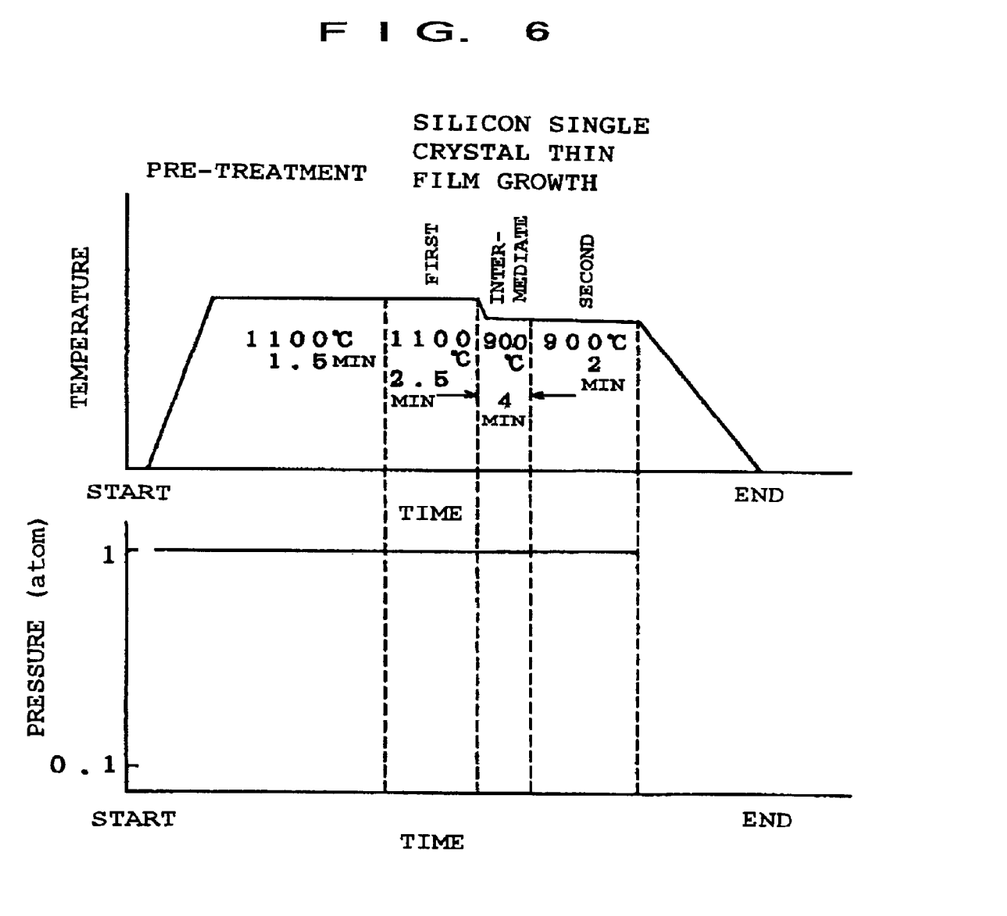
FIG. 6 is a graph showing processing steps and processing conditions (temperature, pressure, etc.) in Comparative Example 1.

The processing conditions of the respective steps from the pre-treatment step to the second vapor phase growth step are illustrated in FIG. 6. In this case, a transition width at an interface between the first and second layers was 1.6 μm that is just twice that of the above Examples.

In order to examine crystal defects in silicon single crystals obtained in Examples 1 and 2, the crystals were subjected to a CMOS simulation process, and the crystals were cleaved to observe their cleaved sections based on a light scattering method. As a result of the observation, it has been found that, in either wafer, no crystal defect is generated in the first and second layers and the first layer has effects similar to the DZ layer.

In accordance with the present invention, there can be formed a layer which has effects similar to the DZ layer in substantially the same order as when high-temperature heat treatment is carried out in the prior art.

Further, when it is desired to form a single crystal thin film having a low impurity concentration on a single crystal substrate having a high impurity concentration by the vapor phase growth process, there can be fabricated a silicon single crystal in which a dopant concentration abruptly changes at an interface between high- and low-concentration layers when compared with that in the prior art method.

In accordance with the present invention, furthermore, an intermediate step is provided between the first and second vapor phase growth steps and, in this intermediate step, impurities in the purge atmosphere are discharged under such a condition that the pressure of the purge atmosphere is set higher or lower than that in the first vapor phase growth step, whereby a dopant concentration gradient at the interface between high and low concentration layers can be advantageously made much sharp.

What is claimed is:

1. A silicon single crystal characterized by having a silicon single crystal thin film which comprises a first layer formed directly on a silicon single crystal substrate with a same conductivity as the silicon single crystal substrate and a substantially identical impurity concentration as the silicon single crystal substrate through the first layer by a vapor phase growth process, the silicon single crystal substrate being doped with a high impurity concentration, containing interstitial oxygens and being grown by a Czochralski method, and which also comprises a second layer formed directly on the first layer by the vapor phase growth process with the same conductivity as the silicon single crystal substrate and an impurity concentration lower by 3 or more orders of magnitude than the silicon single crystal substrate.

2. A silicon single crystal as set forth in claim 1, characterized in that said first layer has a thickness of 2 to 15 μm.

3. A method for fabricating a silicon single crystal thin film, characterized by including a first vapor phase growth step for forming a first layer directly on a silicon single crystal substrate with a same conductivity as the silicon single crystal substrate substantially identical impurity concentration as the silicon single crystal substrate through the first layer by a vapor phase growth process, the silicon single crystal substrate being doped with a high impurity concentration, and a second vapor phase growth step for forming a second layer directly on the first layer by the vapor phase growth process with the same conductivity as the silicon single crystal substrate and an impurity concentration lower by 3 or more orders of magnitude than the silicon single crystal substrate.

4. A method for fabricating a silicon single crystal thin film as set forth in claim 3, characterized by an intermediate step provided between the first vapor phase growth step and the second vapor phase growth step for purging impurities of a growth atmosphere, wherein pressure in the intermediate step is higher than pressure in the first vapor phase growth step.

5. A method for fabricating a silicon single crystal thin film as set forth in claim 3, characterized by an intermediate step provided between the first vapor phase growth step and the second vapor phase growth step for purging impurities of a growth atmosphere, wherein pressure in the intermediate step is lower than pressure in the first vapor phase growth step.

6. A method for fabricating a silicon single crystal thin film as set forth in claim 3, characterized by an intermediate step provided between the first vapor phase growth step and the second vapor phase growth step for purging impurities of a growth atmosphere by repeating an increase and a decrease in the pressure by once or more.

7. A method for fabricating a silicon single crystal thin film as set forth in claim 4 wherein a temperature of the substrate in said intermediate step is lower than that in the first vapor phase growth step.

8. A method for fabricating a silicon single crystal thin film as set forth in claim 5 wherein a temperature of the substrate in said intermediate step is lower than that in the first vapor phase growth step.

9. A method for fabricating a silicon single crystal thin film as set forth in claim 6 wherein a temperature of the substrate in said intermediate step is lower than that in the first vapor phase growth step.

* * * * *